United States Patent [19]
Chu

[11] Patent Number: 5,675,272
[45] Date of Patent: Oct. 7, 1997

[54] POWER LEVEL SENSING FOR MIXED VOLTAGE CHIP DESIGN

[75] Inventor: Ke-Cheng Chu, Ping-Tung Hsien, Taiwan

[73] Assignee: Taiwan Semiconductor Manufacturing Company Ltd., Hsin-Chu, Taiwan

[21] Appl. No.: 570,063

[22] Filed: Dec. 11, 1995

[51] Int. Cl.$^6$ .................................................... H03L 7/00
[52] U.S. Cl. ............................ 327/142; 327/57; 327/77
[58] Field of Search ................................ 326/16; 327/51, 327/57, 77, 78, 80, 81, 87, 90, 142, 143, 205, 218, 220, 319, 333

[56] References Cited

U.S. PATENT DOCUMENTS

| | | | |
|---|---|---|---|
| 5,343,086 | 8/1994 | Fung et al. | 307/296.1 |
| 5,420,798 | 5/1995 | Lin et al. | 364/483 |
| 5,442,586 | 8/1995 | Javaniford et al. | 365/185 |

*Primary Examiner*—Timothy P. Callahan
*Assistant Examiner*—Jeffrey Zweizig
*Attorney, Agent, or Firm*—George O. Saile; Stephen B. Ackerman

[57] ABSTRACT

A power supply voltage level sensing circuit and its application to circuits that interface with circuits that have performance characteristics that conform to universally accepted standards such as TTL, is described. An input terminal of a threshold shifting means is connected to the power supply to be detected to shift the voltage level of the power supply to a level acceptable by a Schmitt trigger. The threshold voltage level of the Schmitt is set so as to detect the range of the voltages that may be present at the power supply. The output of the Schmitt trigger is the data input to a first flip-flop. A system reset terminal provides a power-on-reset signal to a reset terminal of the first flip-flop and to the clock input of the first flip-flop through a buffer circuit. The power-on-reset signal maintains the output of the first flip-flop at a first level for a period of time after the activation of the power supply. As the power supply achieves is proper operating voltage, the output of the Schmitt trigger will remain at a first level if the voltage of the power supply is lower than the threshold of the Schmitt trigger and assume a second level if the voltage of the power supply is greater than the threshold of the Schmitt trigger. As the power-on-reset changes from a first level to a second level, the data input of the first flip-flop transfers the appropriate level to indicate the power supply voltage level to external circuitry. A second flip-flop will deactivate the Schmitt trigger after the power supply has assumed its correct level and the first flip-flop has transferred the correct signal to the external circuitry.

7 Claims, 3 Drawing Sheets

POWER LEVEL SENSING FOR MIXED VOLTAGE CHIP DESIGN

BACKGROUND OF THE INVENTION

1. Field Of The Invention

This invention relates to the design of voltage level detection circuitry and particularly to the design of circuitry for the sensing of power supply voltage levels in mixed power supply level integrated circuit designs.

2. Description of Related Art

Voltage level detection circuits such as comparators are well understood in the art and are used to determine if a voltage presented at the input of said comparator is greater than or less than an established threshold voltage. The output of the comparator will be at a first level if the input voltage is greater than the threshold voltage or at a second level if the input voltage is less than the threshold voltage.

Today many Very Large Scale Integrated (VLSI) circuit chips must be capable of operating at multiple power supply levels. U.S. Pat. No. 5,343,086 (Fung, et. al.) teaches a circuit for the detection of the difference of two power supply lines on a VLSI chip. As the power supply standards of today's VLSI chips are migrating from 5.0 V to a new standard of 3.3 V, the requirement that circuits operate at either of the two different power supplies or at both within the same chip have become common.

If a VLSI chip is to be operated with both 3.3 V and 5.0 V circuits, then two different types of interface circuits must be designed. The interface circuits usually comply to standard operating specification such as those for a TTL interface. A TTL interface circuit design for a 3.3 V power supply will be different from a TTL interface circuit design for a 5.0 V power supply. This will add complexity to the design of the VLSI circuit chip.

Additionally, if the VLSI chip is to operate from either the 3.3 V or 5.0 V power supplies, the interface circuits must be designed to accommodate changes in the power supply and still meet the interface specifications.

In other areas of integrated circuit design such as electrically programmable read only memory (EPROM), dual voltage operation will be a necessity. The voltage necessary to program an EPROM may be different than from the normal operating power supply voltage. U.S. Pat. No. 5,420,798 demonstrates a circuit that detects the correct voltage necessary for the programming and operation of an EPROM. This is so that the EPROM will not be either programmed or erased during the activation or deactivation of the power supply.

In electrically eraseable programmable read only memory (EEPROM), the source of the voltage for the erasing the EEPROM may be from circuitry on the EEPROM or from external circuitry. U.S. Pat. No. 5,442,586 (Javanifard, et. al.) teaches a technique for the detection and control of the power supply such that erasure of the EEPROM is accomplished correctly.

SUMMARY OF THE INVENTION

An object of this invention is the detection of the magnitude of a power supply voltage level. Another object of this invention is the signaling of the power supply level to interface circuits so that the operating characteristics can be modified to allow the interface circuits to maintain their operating parameters as according to standard specifications.

To accomplish the aforementioned objects, a voltage level sensing circuits is connected between a first power supply that is to be sensed, a second power supply, and a ground reference point. A threshold shifting means is connected to the first power supply to shift the level of the first power supply. The threshold shifting means places the shifted level of the first power supply at the input terminal of a level sensor means. The level sensor means has a Schmitt trigger that is connected to the sensor input terminal, a sensor output terminal, and a feedback leakage control terminal. If the magnitude of the shifted level of the first power supply is greater than a threshold magnitude, the Schmitt trigger will place a signal of a first level on the sensor output terminal. If the magnitude of the shifted level of the first power supply is less than the threshold magnitude, the Schmitt trigger will place a signal of a second level on the sensor output terminal. A first flip-flop circuit that has a data input terminal connected to the sensor output terminal, a clock input terminal, a reset terminal, and an output terminal. A signal present at the clock input terminal, that changes from a first level to a second level, causes the signal that is present at the data input terminal to be transferred to the data output terminal that is connected to the detected result terminal.

A second flip-flop circuit that has a data input terminal that is connected to the second power supply, a clock input terminal, a reset terminal, and an output terminal that is connected to the feedback leakage terminal to disable the Schmitt trigger after the first power supply voltage level has been determined.

A system reset terminal is connected to the reset terminals of the first and second flip-flop circuits and to a buffer circuit. The system reset terminal has a power-on-reset signal placed on it. This causes the output terminals of the first and second flip-flop circuits to change to the second level when the power-on-reset signal is active.

The output from the buffer circuit is connected to the clock input terminals of the first and second flip-flop circuits. The power-on-reset signal will change from active to inactive and this change will be presented to the clock input terminal and cause the output terminals of the first and second flip-flop circuits to have the signal or voltage present at the input terminals to be transferred to it.

DETAILED DESCRIPTION OF THE INVENTION

When VLSI circuits are to be powered by either of two different power supply levels or a mixture of the two different power supply levels such as 3.3 V and 5.0 V, interface circuits need to be signaled which power supply level is being used so that the characteristics of the interface circuits can be adjusted to maintain their input and output parameters. The power supply level sensor circuit will have to detect the power supply levels that are within the tolerance of the nominal power supply value. For instance if the power supplies have a tolerance of +10%, the 3.3 V power supply can be as large as 3.63 V and the 5.0 V power supply can be as small as 4.5 V and still be considered to have the circuitry operating properly. A voltage threshold for the power supply level sensor circuit will be established at a middle point between the highest value of the lower power supply level and the lowest value of the higher power supply level. In the case of the 3.3 V and 5.0 V power supplies, this threshold is about 4.2 V. If the power supply level is less than the threshold level, then the power supply level sensor will put a signal of a first level on the output terminal. If the power supply level is greater than the -threshold level, then the power supply level sensor will put a signal of a second level on the output terminal.

Figure 1:
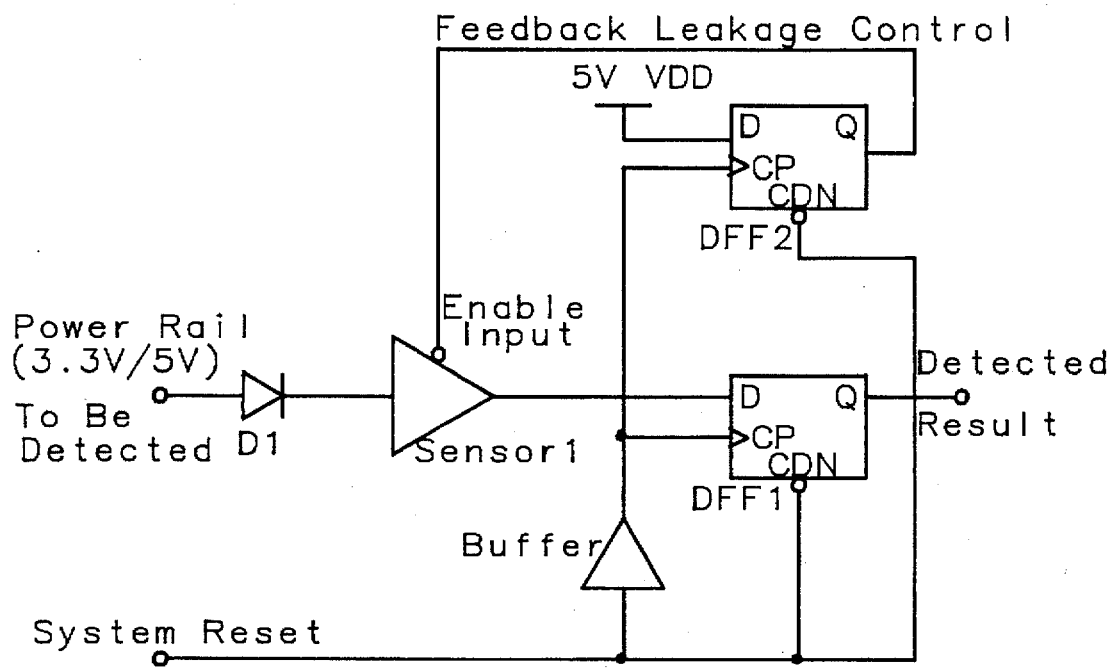
FIG. 1 is a schematic diagram of the preferred embodiment of the voltage level sensing circuit of this invention.

The power supply level sensor is shown in FIG. 1 The diode D1 is connected to the power supply (Power Rail)to be sensed. The diode D1 shifts the voltage at the Power Rail down by the threshold value (VT) of an N-type Metal Oxide Semiconductor (NMOS) field effect transistor (FET) to a level acceptable by a Schmitt trigger sensor1. For the 3.3 V and 5.0 V power supplies, this level would be approximately 3.2 V.

The output of the Schmitt trigger sensor1 is the data input D of flip-flop DFF1. The data input D is transferred to the output Q of the flip-flop DFF1 when the clock input CP changes from a first level to a second level. This output is the Detected Result and is maintained as long as the power supply is active.

The System Reset Terminal is connected to the reset terminal CDN of the flip-flop DFF1 and flip-flop DFF2. The power-on-reset signal that is present on the System Reset Terminal will force the outputs Q of the flip-flop DFF1 and flip-flop DFF2 to the first level during the period that the power-on-reset is active. Also connected to the System Reset Terminal is the Buffer. The Buffer output is then connected to the clock input terminals CP of the flip-flop DFF1 and flip-flop DFF2. As the power-on-reset signal goes from an active state to an inactive state, the data inputs D of flip-flop DFF1 and flip-flop DFF2 are transferred to their output Q.

The data input D of flip-flop DFF2 is a second power supply 5 vVdd. When the power-on-reset goes from active to inactive the output Q of flip-flop DFF2 goes to the second level. The output Q of flip-flop DFF2 is the input to the Enable Input Schmitt trigger sensor that is the Feedback Leakage Control. This will disable the Schmitt trigger after the power-on-reset has become inactive.

Figure 2A:
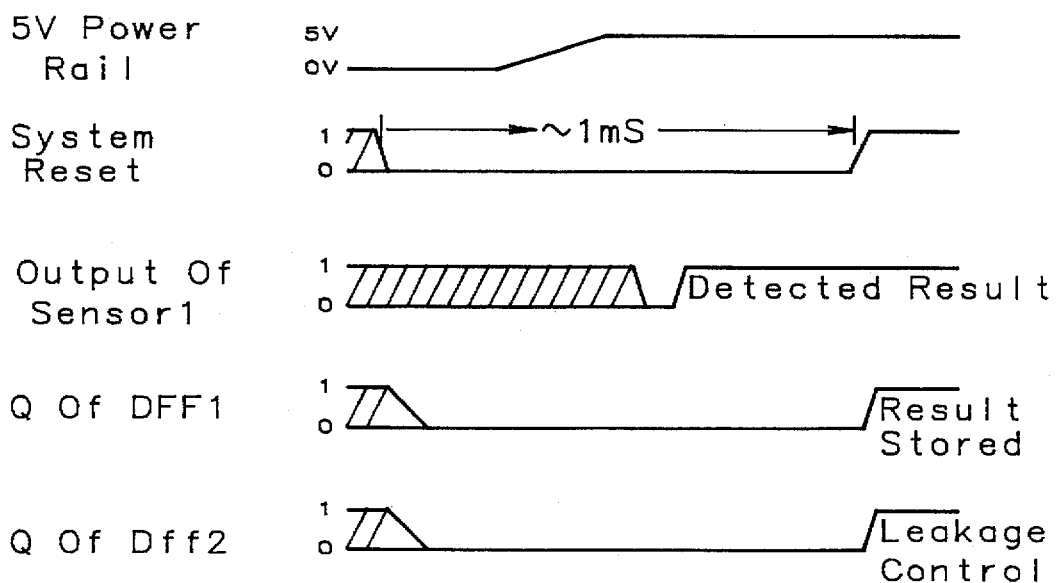
FIG. 2 is a diagram of the wave forms of the operation of the voltage level sensing circuit of this invention.

The wave forms for the case when the power supply is 5.0 V is shown in FIG. 2a. As the power supply is activated, the voltage at the 5 v Power Rail rises from 0 V to 5.0 V. The System Reset remains at the first level (0) for a period of time of approximately 1 milli-second at which time the System Reset is changed to the second level (1). Once the 5 v Power Rail is stable at the 5.0 V level, the Output of Sensor 1 changes to the second level (1). The output of the first flip-flop (Q of DFF1) is held at the first level (0) until the System Reset changes from the first level (0) to the second level (1) at which time the output of the first flip-flop (Q of DFF1) becomes the second level (1). The output of the second flip-flop Q of DFF2) changes from the first level (0) to the second level (1) at the same time the System Reset changes from the first level (0) to the second level (1). This disables the Schmitt trigger sensor1 of FIG. 1.

Figure 2B:
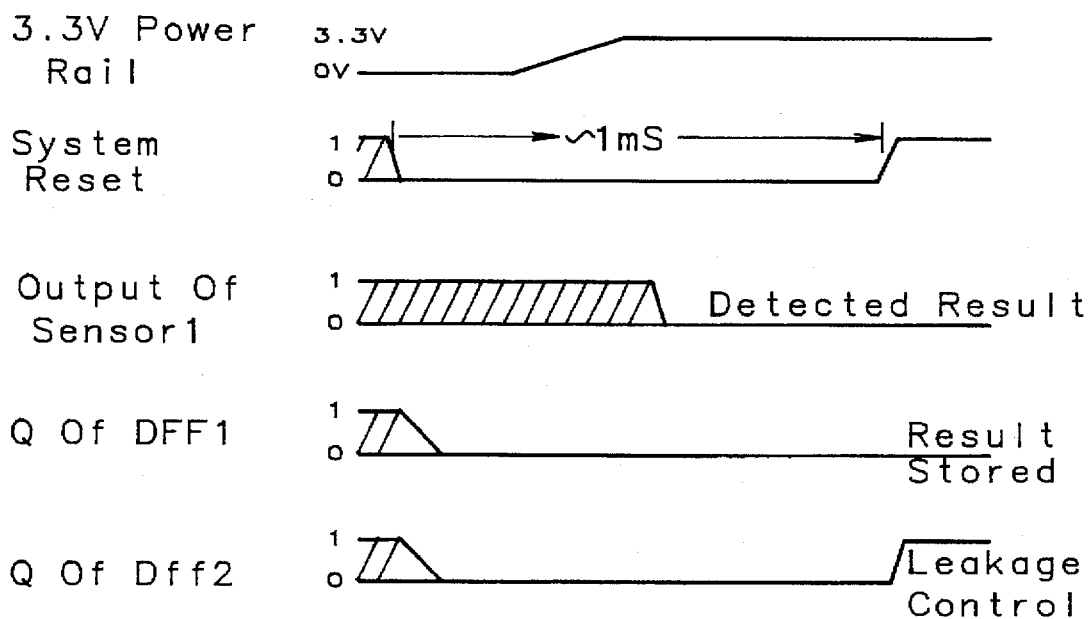

FIG. 2b illustrates the wave forms for a 3.3 power supply. As the power supply is turned on, the 3.3 V Power Rail goes from 0 V to 3.3 V. The System Reset is the same as with the 5.0 V power supply case and remains at the first level (0) for 1 milli-second before rising to the second level (1). The Output Of Sensor 1 will stay at the first level (0) until 3.3 V Power Rail reaches a steady level at which time the Output of Sensor 1 will change to the second level (1). The output of the first flip-flop (Q of DFF1) will remain at the first level since the voltage at the 3.3 V Power Rail is not greater than the threshold of the Schmitt trigger (sensor1 of FIG. 1). The output of the second flip-flop (Q of DFF2) will change from the first level (0) to the second level (1) thus disabling the Schmitt trigger (sensor1 of FIG. 1 ) when the System Reset rises from the first level (0) to the second level (1).

Figure 3A:
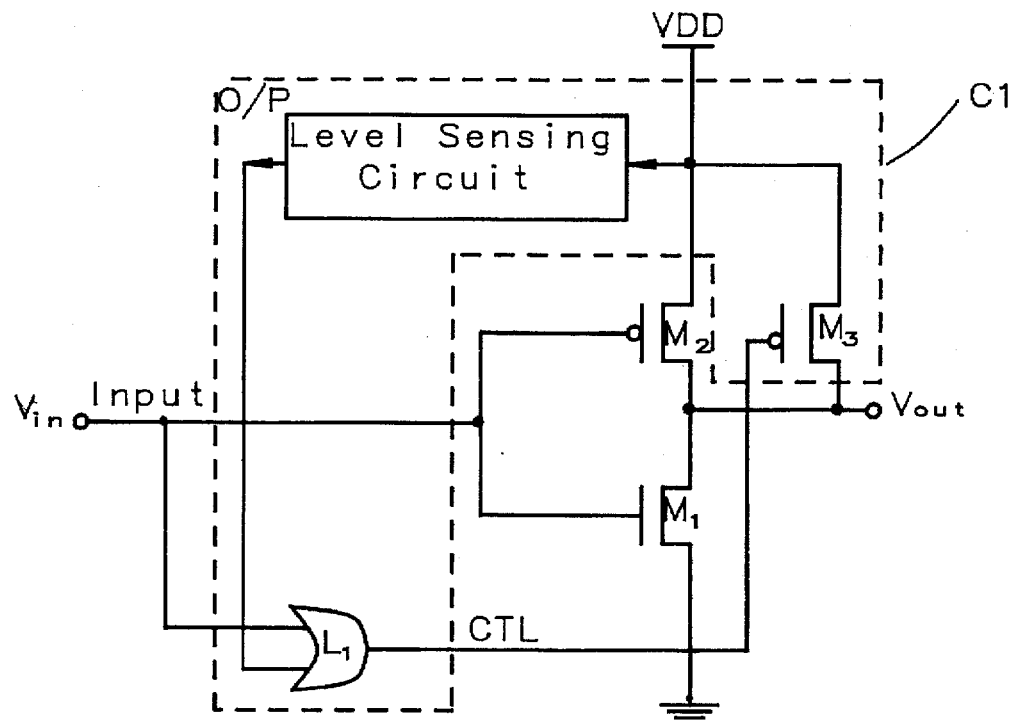
FIG. 3 is a schematic diagram of the application of the voltage level sensing circuit of this invention in an interface shifting circuit.
Figure 3B:
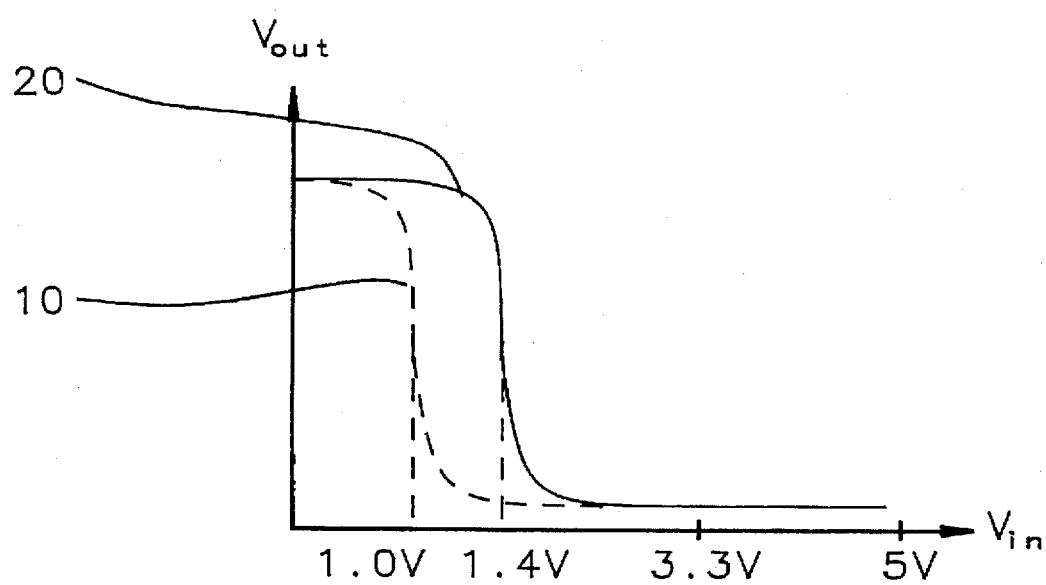

An application of the power supply level sensing circuit is shown in FIG. 3a. NMOS FET M1 and PMOS FET M2 form a TTL input level shifter. The transfer characteristics of this circuit without the circuit C1 is shown in FIG. 3b. If the power supply Vdd is 3.3 V, the transfer characteristic of Vout versus Vin is shown in curve 20, but if the power supply Vdd is 5.0 V, the transfer characteristic is curve 10. For the circuit to be compliant with the specification for TTL the transfer characteristic for both the power supply levels must follow curve 20. This means that the TTL level shifter that is composed only of NMOS FET M1 and PMOS FET M2 can not operate correctly at both 5.0 V and 3.3 V power supplies.

Figure 3C:
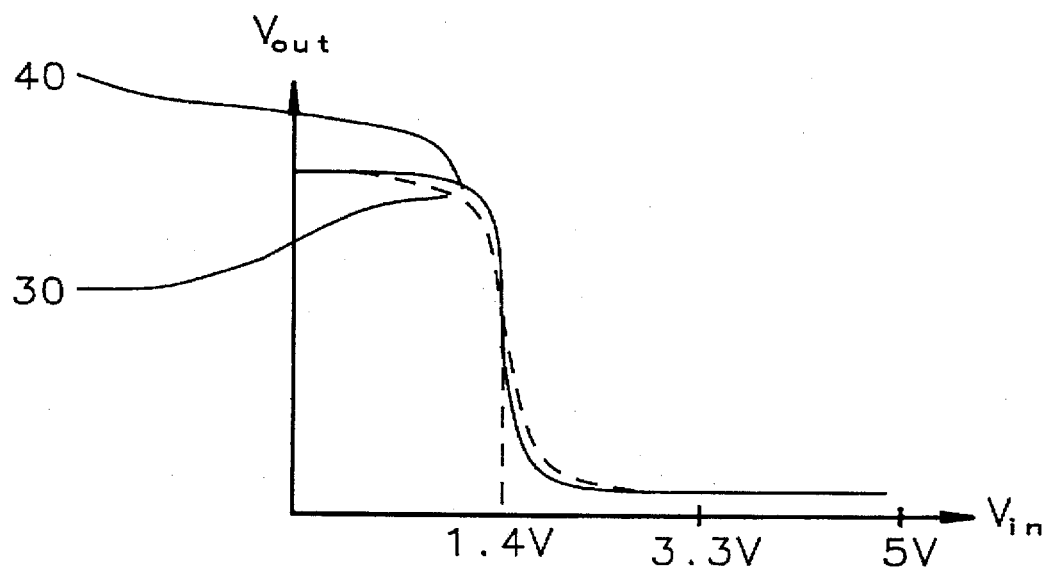

To make the TTL level shifter operate correctly at both 5.0 V and 3.3 V power supplies, circuit C1 must be included. Circuit C1 consists of the level sensing circuit, the OR logic gate L1, and PMOS FET M3. The PMOS FET M3 is in parallel with the PMOS FET M2. This adjusts the effective device size of the PMOS FET so that the transfer characteristic 40 of FIG. 3c for the 5.0 V power supply is closely matched by the transfer characteristic 30 of FIG. 3c of the 3.3 V power supply.

The level sensing circuit detects the level of the power supply Vdd. If the power supply Vdd is 3.3 V its output is a level zero which sets the logic gate L1 to a state as to prevent PMOS FET M3 from conducting. If the power supply Vdd is 5.0 V its output is a level one which sets the state of the logic gate L1 to be switched by the input Vin. This allows both the PMOS FET's M2, M3 to be switched to a conducting or non-conducting state practically simultaneously. This allows the transfer characteristic for the circuit to be nearly identical for either power supply voltage level of 3.3 V or 5.0 V.

While the invention has been particularly shown and described with reference to the preferred embodiments thereof, it will be understood by those skilled in the art that various changes in form and details may be made without departing from the spirit and scope of the invention.

What is claimed is:

1. A voltage level sensing circuit coupled between a first voltage source of a first magnitude, a second voltage source of a second magnitude, and a ground reference point to detect that the first magnitude is equal to the second magnitude, comprising:

a) a threshold shifting means comprising an input terminal connected to the first voltage source, an output terminal, and a level shifting circuit connected between the input terminal and the output terminal to shift the first magnitude of the first voltage source to a third magnitude and place said third magnitude at the output terminal;

b) a level sensor means comprising a sensor input terminal connected to the output terminal of the threshold shifting means, a sensor output terminal, a feedback leakage control terminal, and a Schmitt trigger circuit connected between the sensor input terminal, the sensor output terminal, and the leakage control terminal, wherein the sensor output has a sensor signal having a first level if the magnitude of the first voltage source is greater than a threshold voltage level and a second level if the first voltage source is less than the threshold voltage level;

c) a first flip-flop circuit comprising a data input terminal connected to the sensor output terminal, a clock input terminal, a reset terminal, a data output terminal a detected result terminal connected to the data output terminal to transfer a detected result signal to external circuitry, and a bistable multivibrator means connected to the data input terminal, the clock input terminal, the reset terminal and the data output terminal;

d) a second flip-flop circuit comprising a data input terminal connected to the second voltage source, a clock input terminal, a reset terminal, a data output terminal connected to the feedback leakage control terminal, and a bistable multivibrator means connected to the data input terminal, the clock input terminal, the reset terminal and the data output terminal;

e) a system reset terminal coupled to the reset terminals of the first and second flip flops to provide a power-on-reset signal to said voltage level sensing circuit, wherein the power-on-reset signal changes from a first logic level to a second logic level at a period of time after the first and second voltage sources are activated and while the power-on-reset signal is at the first level, the detected result signal assumes a first output level; and f) a buffer circuit connected between the system reset terminal and the clock input terminals of the first and second flip-flops circuits to delay the power-on-reset signal.

2. The circuit of claim 1 wherein the delayed power-on-reset signal changing from the first logic level to the second logic level causes the sensor signal to be transferred to the detected result signal and causes the data output terminal of the second flip-flop circuit to generate a feedback leakage control signal that will deactivate the level sensor means.

3. A power supply adaptive interface circuit within an integrated circuit to adjust a set of circuit performance characteristics of said interface circuit dependent upon a set of input parameters for said circuit, comprising:

a) a power supply connection means to couple said circuit to an interface power supply voltage source;

b) a power supply level sensing circuit coupled between the interface power supply connection means and a ground reference terminal to determine a magnitude of the power supply voltage source and to couple the determination of the magnitude to an interface output means;

c) an interface input means to couple input signals from external circuitry to said circuit; and d) the interface output means to adapt the set of performance characteristics according to the determination of the magnitude of the interface power supply voltage source and couple the input signals to external circuitry.

4. The circuit of claim 3 wherein said of input parameters comply with with a standard operating specification wherein said standard operating specification includes such specifications as a TTL interface for 3.3 V power supply and a TTL interface for 5.0 V power supply.

5. The circuit of claim 3 wherein the performance characteristics insure that the coupling of the input signals to the external circuitry comply with the standard operating specification.

6. The power supply adaptive interface of claim 3 wherein a power supply level sensing circuit is coupled between an internal power supply voltage source of a first magnitude, the interface power supply voltage source of a second magnitude, and a ground reference point, comprising:

a) a threshold shifting means comprising an input terminal connected to the first voltage source, an output terminal, and a level shifting circuit connected between the input terminal and the output terminal to shift the first magnitude of the first voltage source to a third magnitude and place said third magnitude at the output terminal;

b) a level sensor means comprising a sensor input terminal connected to the output terminal of the threshold shifting means, a sensor output terminal, a feedback leakage control terminal, and a Schmitt trigger circuit connected between the sensor input terminal, the sensor output terminal, and the leakage control terminal, wherein the sensor output has a sensor signal having a first level if the magnitude of the first voltage source is greater than a threshold voltage level and second level is the first voltage source is less than the threshold voltage level;

c) a first flip-flop circuit comprising a data input terminal connected to the sensor output terminal, a clock input terminal, a reset terminal, a data output terminal, a detected result terminal connected to the data output terminal to transfer the determination to external circuitry, and a bistable multivibrator means connected to the data input terminal, the clock input terminal, the reset terminal and the data output terminal;

d) a second flip-flop circuit comprising a data input terminal connected to the second voltage source, a clock input terminal, a reset terminal, a data output terminal connected to the feedback leakage control terminal, and a bistable multivibrator means connected to the data input terminal, the clock input terminal, the reset terminal and the data output terminal;

e) a system reset terminal coupled to the reset terminals of the first and second flip flops to provide a power-on-reset signal to said voltage level sensing circuit, wherein the power-on-reset signal changes from a first logic level to a second logic level at a period of time after the first and second voltage sources are activated and while the power-on-reset signal is at the first level, the detected result signal assumes a first output level; and f) a buffer circuit connected between the system reset terminal and the clock input terminals of the first and second flip-flops circuits to delay the power-on-reset signal.

7. The circuit of claim 6 wherein the delayed power-on-reset signal changing from the first logic level to the second logic level causes the sensor signal to be transferred to the detected result signal causes the data output terminal of the second flip-flop circuit to generate a feedback leakage control signal that will deactivate the level sensor means.

* * * * *